United States Patent
Sorimachi (10) Patent No.: US 7,342,248 B2
(45) Date of Patent: Mar. 11, 2008

(54) SEMICONDUCTOR DEVICE AND INTERPOSER

(75) Inventor: Haruo Sorimachi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 162 days.

(21) Appl. No.: 10/521,195

(22) PCT Filed: Apr. 15, 2004

(86) PCT No.: PCT/JP2004/005353

§ 371 (c)(1),
(2), (4) Date: Jan. 13, 2005

(87) PCT Pub. No.: WO2004/102653

PCT Pub. Date: Nov. 25, 2004

(65) Prior Publication Data

US 2005/0258853 A1    Nov. 24, 2005

(30) Foreign Application Priority Data

May 15, 2003    (JP)    ............................. 2003-136863

(51) Int. Cl.
*H01L 23/58*    (2006.01)

(52) U.S. Cl. ...................................................... 257/48

(58) Field of Classification Search ................... 257/48; 324/763, 765
See application file for complete search history.

(56) References Cited

U.S. PATENT DOCUMENTS

| | | | | |
|---|---|---|---|---|
| 6,534,853 | B2 * | 3/2003 | Liu et al. | 257/692 |
| 2005/0030055 | A1 * | 2/2005 | Tran et al. | 324/763 |
| 2005/0173790 | A1 * | 8/2005 | Akram | 257/690 |

FOREIGN PATENT DOCUMENTS

| | | | |
|---|---|---|---|
| JP | 5-102254 | * | 4/1993 |
| JP | 7-122603 | | 5/1995 |
| JP | 2002-151644 | | 5/2002 |
| JP | 2003-84042 | | 3/2003 |

* cited by examiner

*Primary Examiner*—Thien F Tran
(74) *Attorney, Agent, or Firm*—Staas & Halsey LLP

(57) ABSTRACT

A semiconductor device characterized in that connection pads for wire bonding are arranged at peripheral regions of an electrode terminal formation surface of a semiconductor chip, test pads for testing the semiconductor chip are arranged in an inside region surrounded by said peripheral regions of said electrode terminal formation surface, and a plurality of rewiring patterns extend from the peripheral regions to said inside region of said electrode terminal formation surface and the individual rewiring patterns connect the individual electrode terminals and the corresponding connection pads and test pads.

7 Claims, 6 Drawing Sheets

PRIOR ART

Fig.11

SEMICONDUCTOR DEVICE AND INTERPOSER

TECHNICAL FIELD

The present invention relates to a semiconductor device and an interposer provided with test pads for testing properties of a semiconductor chip included in them.

BACKGROUND ART

Semiconductor devices, for example as disclosed in Japanese Unexamined Patent Publication (Kokai) No. 2002-151644, include single semiconductor devices into which a plurality of semiconductor chips or a plurality of semiconductor devices are assembled, that is, stack semiconductor devices.

Figure 10:
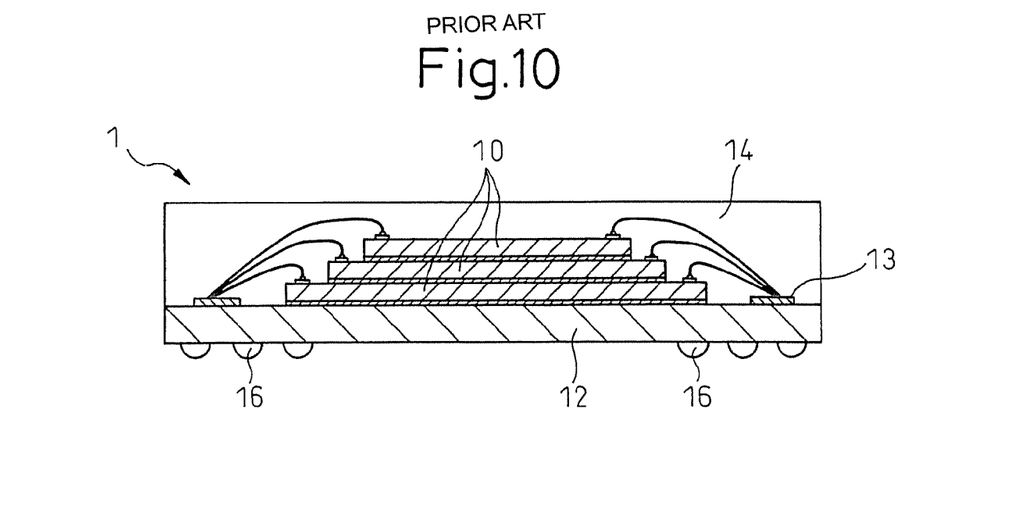
FIG. 10 is a cross-sectional view of an example of the configuration of a conventional semiconductor device.

The stack semiconductor device 1 shown in FIG. 10 has a structure called a "multi-chip package" or a "die stack". Semiconductor chips 10 are stacked on a board 12, the semiconductor chips 10 and connection electrodes 13 provided on the board 12 are connected by wire bonding, one surface of the board 12 (surface on which semiconductor chips are carried) is sealed by a sealing resin 14, and solder balls 16 are connected to the mounting surface of the board 12.

Figure 11:
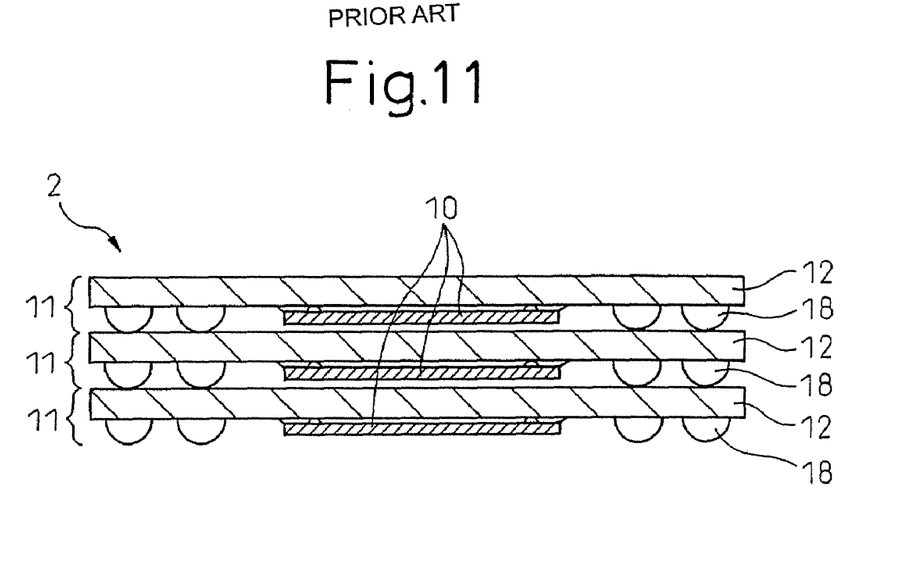
FIG. 11 is a cross-sectional view of another example of the configuration of a conventional semiconductor device.

The stack semiconductor device 2 shown in FIG. 11 has a so-called "package stack" structure. A plurality of semiconductor devices 11 comprised of boards 12 on which semiconductor chips 10 are mounted by flip-chip connection are stacked. The semiconductor devices 11 are electrically connected through solder balls 18 between the boards 12.

The stack semiconductor device 1 having the multi-chip package or die stack structure shown in FIG. 10 has the advantage of enabling a plurality of semiconductor chips 10 to be compactly housed in a single stack semiconductor device 1.

However, there is the problem that product tests are conducted by using the solder balls 16 as test pads after a plurality of semiconductor chips 10 are placed on the boards 12, so if even just some of the semiconductor chips 10 are defective, the product 1 as a whole is judged defective and even the good semiconductor chips 10 end up being discarded.

This problem becomes more serious the greater the number of the semiconductor chips 10 stacked. That is, if the number of the semiconductor chips 10 stacked increases, the probability will rise of defective semiconductor chips 10 being included in the product 1, so the defect rate of the product 1 will rise and good semiconductor chips 10 wastefully discarded will increase.

To solve this problem, it is sufficient to test the individual semiconductor chips 10 to judge if they are good or defective in advance, then place them on the boards 12. However, directly testing conventional semiconductor chips 10 has been difficult due to the following reasons.

That is, testing semiconductor chips 10 requires that the electrode terminals (aluminum pads) be connected to the test apparatus, but electrode terminals are arranged at intervals of a narrow 50 to 100 μm, so it is necessary to use a special test apparatus provided with special sockets for connection with the electrode terminals. Due to this, the production costs are raised.

As opposed to this, in the case of the stack semiconductor device 2 shown in FIG. 11, the semiconductor devices 11 comprised of the semiconductor chips 10 placed on the boards 12 can be individually tested to judge if they are good or defective in advance, then a plurality of only the good semiconductor devices 11 stacked to obtain the product 2.

With this method, however, (1) the number of the boards 12 increases and the production costs increase, (2) the boards 12 are joined at the board peripheries at the outside from the regions for carrying the semiconductor chips 10, so the planar dimensions of the semiconductor devices 11 and in the end the planar dimensions of the stack semiconductor device 2 cannot be reduced, and (3) since a plurality of not only semiconductor chips 10 and boards 12 are stacked, the stack semiconductor device 2 as a whole increases in thickness.

DISCLOSURE OF THE INVENTION

An object of the present invention is to provide a semiconductor device enabling properties of semiconductor chips assembled in it to be easily tested without requiring any special test apparatus, carrying only good semiconductor chips and thereby improving the product yield, and able to be produced by existing facilities to keep production costs to a minimum.

Another object of the present invention is to provide an interposer enabling properties of semiconductor chips assembled in it to be easily tested without requiring any special test apparatus, carrying only good semiconductor chips and thereby improving the product yield, and enabling production of semiconductor devices by existing facilities to keep production costs to a minimum.

To achieve the above objects, according to a first aspect of the invention, there is provided a semiconductor device wherein connection pads for wire bonding are arranged at peripheral regions of an electrode terminal formation surface of a semiconductor chip, test pads for testing the semiconductor chip are arranged in an inside region surrounded by said peripheral regions of said electrode terminal formation surface, and a plurality of rewiring patterns extend from the peripheral regions to said inside region of said electrode terminal formation surface and individual rewiring patterns connect the individual electrode terminals and the corresponding connection pads and test pads.

Typically, said test pads are arranged in an array on said inside region.

Typically, said electrode terminals are exposed from openings of a protective insulation layer covering said electrode terminal formation surface, said rewiring patterns extend on said protective insulation layer and are connected to said electrode terminals via said openings, said rewiring patterns and said protective insulation layer are further covered by an insulation layer, and said connection pads and said test pads connected to said rewiring patterns are exposed from openings of said insulation layer.

In the first aspect of the invention, there is further provided a semiconductor device comprised of one or a stack of a plurality of the above semiconductor device as an element semiconductor device or a stack of one or more of each of said element semiconductor device and a semiconductor chip carried on a wiring board, said semiconductor device characterized in that connection pads of each said element semiconductor device and connection electrodes of said wiring board are connected by wire bonding, and each said element semiconductor device and/or each said semiconductor chip is sealed by resin on said wiring board.

Further, to achieve the above objects, according to a second aspect of the invention, there is provided an interposer characterized in that connection pads for wire bonding to be connected to a wiring board are arranged at peripheral regions of one surface of the interposer for carrying a semiconductor chip, test pads for testing the semiconductor chip are arranged in an inside region surrounded by said peripheral regions of said one surface or the other surface, and a plurality of rewiring patterns extend from said peripheral regions to said inside region and the individual rewiring patterns connect the corresponding connection pads and test pads.

Typically, said test pads are arranged in an array in said inside region.

In the second aspect of the invention, further, there is provided a semiconductor device comprised of a semiconductor module, comprised of said interposer on the surface of which, opposite to the surface where said test pads are arranged, one or a plurality of said semiconductor chips are stacked, carried on a wiring board, said semiconductor device characterized in that connection pads of said interposer and connection electrodes of said wiring board are connected by wire bonding, and said semiconductor module is sealed by resin on said wiring board.

BEST MODE FOR CARRYING OUT THE INVENTION

Below, preferred embodiments of the present invention will be explained with reference to the attached drawings.

EXAMPLE 1

Figure 1:
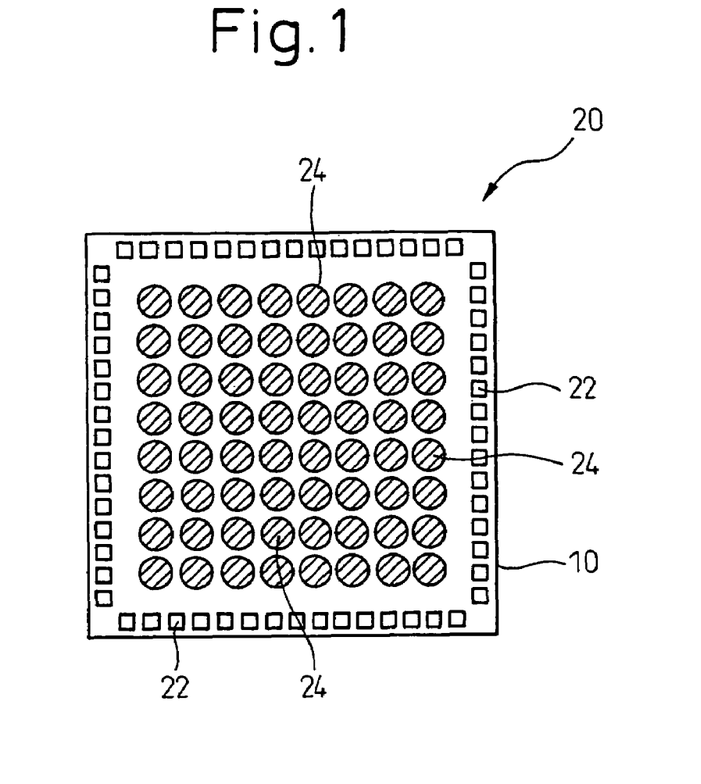
FIG. 1 is a plan view of an electrode terminal formation surface of a semiconductor device according to a first aspect of the invention.

FIG. 1 is a plan view of an example of a semiconductor device according to a first aspect of the invention and shows an example of the configuration of the characterizing electrode terminal formation surface. The illustrated semiconductor device 20 is obtained by forming wiring patterns all together on an electrode terminal formation surface of a semiconductor wafer, then dicing the semiconductor wafer into individual semiconductor chips.

The semiconductor device 20 is provided with connection pads 22 in single rows along peripheral regions of an electrode terminal formation surface of a semiconductor chip 10 and is provided with test pads 24 in an array of a plurality of rows in an inside region surrounded by the peripheral regions.

When mounting the semiconductor device 20 on a mounting board etc., the connection pads 22 of the semiconductor device 20 and the connection terminals of the mounting board are connected by wire bonding. By the connection pads 22 being provided in single rows along the peripheral regions of the semiconductor device 20 (=peripheral regions of the semiconductor chip 10), the above wire bonding becomes easy. The individual connection pads 22, as explained later, connect with the individual electrode terminals of the semiconductor chip 10 through rewiring patterns.

The test pads 24 are used for connection with a test apparatus when testing the properties of the semiconductor chip 10. The individual test pads 24, as explained later, connect with the individual electrode terminals of the semiconductor chip 10 through rewiring patterns the same as above.

To make the semiconductor chip 10 and the semiconductor device 20 as small as possible, the connection pads 22 are made the smallest planar dimensions enabling wire bonding and arranged at a high density in single rows. On the other hand, a large area region is left unused at the inside from the peripheral regions where the connection pads 22 are arranged. In the present invention, this large area inside region is effectively utilized to enable test pads 24 to be arranged in large planar dimensions and large intervals. Here, the connection pads 22 in practice have to be arranged in one row or two rows in order to ensure ease of wire bonding. As opposed to this, the test pads 24, which have no relation to wire bonding, can be arranged in an array of a plurality of rows, so can make full use of the large area of the inside region. This is also extremely advantageous in enlarging the planar dimensions and intervals of the test pads 24.

In this way, by arranging the test pads 24 in large planar dimensions at wide intervals, it is possible to test the properties of the semiconductor chip 10 without requiring a specialized test apparatus provided with sockets etc. having special probes.

Figure 2:
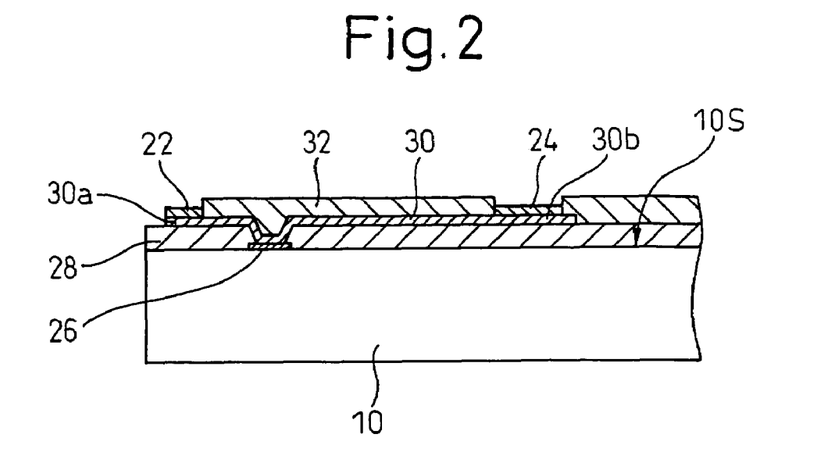
FIG. 2 is a cross-sectional view of the positional relationship of connection pads, test pads, and electrode terminals of a semiconductor device according to the first aspect of the invention.

FIG. 2 is a cross-sectional view of the semiconductor device 20 shown in FIG. 1 and shows the positional relationship of the connection pads 22, test pads 24, and electrode terminals 26. The electrode terminals 26 are formed as aluminum pads on the electrode terminal formation surface 10S of the semiconductor chip 10. The electrode terminal formation surface 10S of the semiconductor chip 10 is covered over its entirety other than the electrode terminals 26 with a protective insulation layer 28. The surface of the protective insulation layer 28 is formed with rewiring patterns 30 and is covered over that with an insulation layer 32. The connection pads 22 and the test pads 24 are directly formed at predetermined locations on the rewiring patterns 30 and are exposed through the through holes of the insulation layer 32.

That is, the rewiring patterns 30 extend from the electrode terminals 26 over the protective insulation layer 28 to the peripheral regions and inside region of the semiconductor chip 10. At the peripheral regions, ends 30a are connected to the connection pads 22, while at the inside region, ends 30b are connected to the test pads 24.

By leading out ends 30a of the wiring patterns 30 from the electrode terminals 26 up to the peripheral regions and connecting them to the connection pads 22, wire bonding with the connection pads 22 becomes easier and simultaneously the inside region for arrangement of the test pads 24 is secured wider.

In this example, the test pads 24 are arranged in an array, so the rewiring patterns 30 for connecting the connection pads 22 and the test pads have to be arranged so as not to interfere with each other. Of course, the arrangement of the test pads 24 does not have to be limited to the array shown in the present example. The pads may be arranged freely.

Note that in the present example, the electrode terminals 26 are shown arranged in single rows at the regions close to the periphery of the electrode terminal formation surface 10S, but the arrangement of the electrode terminals in the semiconductor device of the present invention does not have to be limited to this. For example, even if a plurality of electrode terminals are arranged in a region close to the center of the electrode terminal formation surface, by suitably designing the rewiring patterns 30, it is possible to apply the configuration of the present invention of arranging the connection pads 22 at the peripheral regions of the electrode terminal formation surface and arranging the test pads 24 at the inside region.

FIGS. 3A to 3H are cross-sectional views of an example of the production steps of a semiconductor device according to the present invention.

Figure 3A:
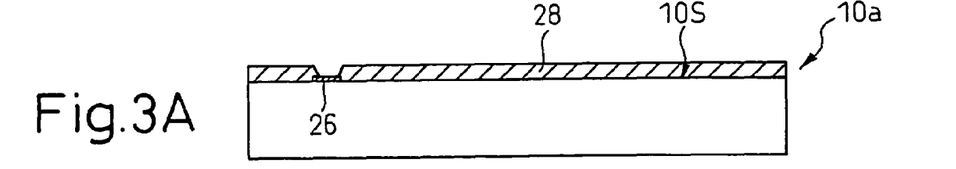
FIGS. 3A to 3H are cross-sectional views of steps of production of a semiconductor device according to the first aspect of the invention.

FIG. 3A is a cross-sectional view of part of a semiconductor wafer 10a. An electrode terminal formation surface 10S is covered by a protective insulation layer 28 at parts other than the electrode terminals 26 comprised of aluminum pads. The protective insulation layer 28 may be a passivation film covering the electrode terminal formation surface 10S of the semiconductor wafer 10a used as it is or the passivation film further covered by a polyimide or other resin film for strengthening its protective action and insulation action.

Figure 3B:
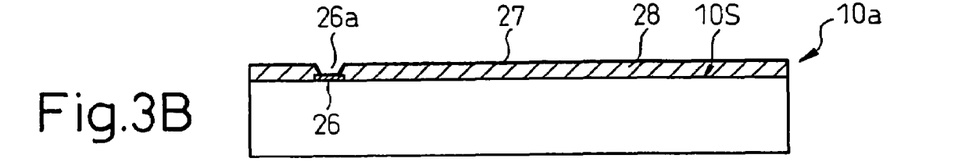

Next, as shown in FIG. 3B, as pretreatment for forming the rewiring patterns 30 (FIG. 2) for connection to the electrode terminals 26 by plating, sputtering etc. is used to form over the entire top surface of the wafer 10a (top surface of protective insulation layer 28, wall surfaces of openings 26a through which electrode terminals 26 are exposed, and top surfaces of electrode terminals 26) a plating power layer 27. The plating power layer 27 is for example comprised of a chromium layer, copper layer, etc.

Figure 3C:
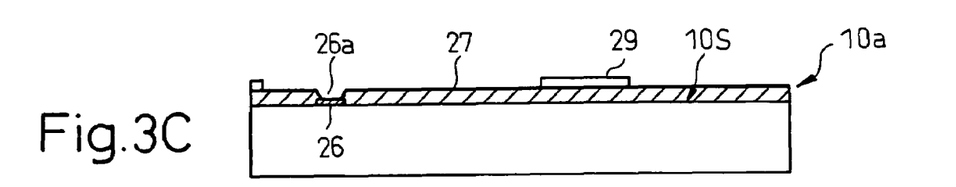

As shown in FIG. 3C, photolithography and resin curing processing are performed to form photoresist patterns 29 as a plating mask on locations other than the locations scheduled for formation of the rewiring patterns 30 on the plating power layer 27.

Figure 3D:
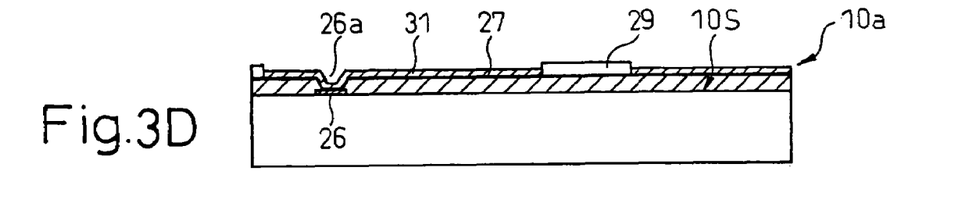

As shown in FIG. 3D, the plating power layer 27 is used for electroplating copper so as to form an electroplated copper layer 31 on the plating power layer 27 at locations not covered by the mask 29. The obtained electroplated copper layer 31 forms a conductive layer continuing from the surfaces of the electrode terminals 26 exposed at the openings 26a through the wall surfaces of the openings 26a to the protective insulation layer 28.

Figure 3E:
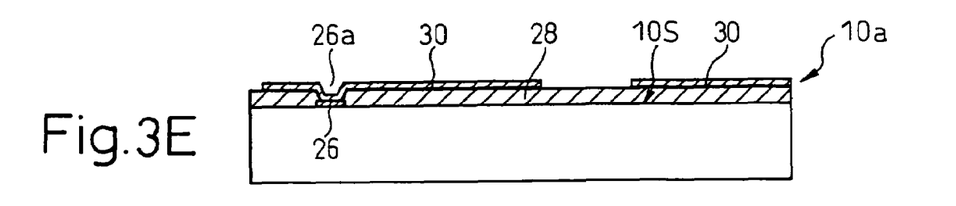

As shown in FIG. 3E, the photoresist patterns 29 used as the plating mask are removed to expose the underlying plating power layer 27, then the metal forming the power layer is etched lightly using an etching solution so as to selectively remove only the exposed plating power layer 27. Due to this, rewiring patterns 30 are formed at only predetermined locations.

The plating power layer 27 need only be a temporary conductive layer able to supply plating current at the time of start of plating, so is formed extremely thin by sputtering etc. as explained above and so is simply removed by light etching. As opposed to this, the copper electroplated layer 31 must form permanent rewiring patterns 30, so is formed to a sufficient thickness adding the margin for removal by the above light etching. Therefore, it is possible to selectively remove only the thin plating power layer 27.

Due to this, rewiring patterns 30 connecting the electrode terminals 26 and extending on the protective insulation layer 28 are obtained.

Figure 3F:
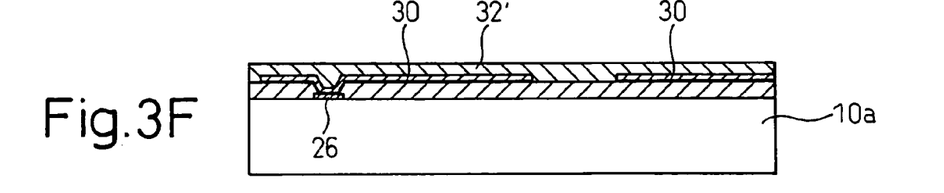

As shown in FIG. 3F, the entire surface of the semiconductor wafer 10a where the rewiring patterns 30 are formed is covered by a photosensitive polyimide or other photosensitive resin film 32'.

Figure 3G:
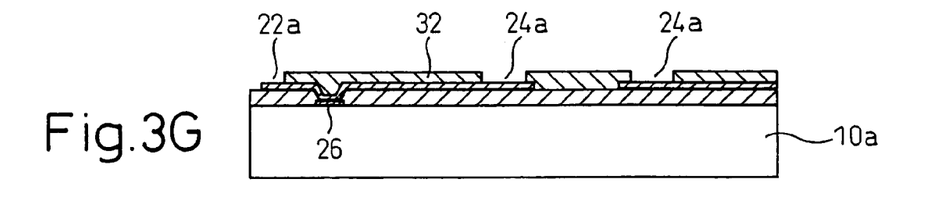

As shown in FIG. 3G, the coating layer 32' of the photosensitive resin film is exposed and developed, whereby openings 22a are formed at scheduled locations for formation of the connection pads and openings 24a are formed at scheduled locations for formation of the test pads.

Figure 3H:
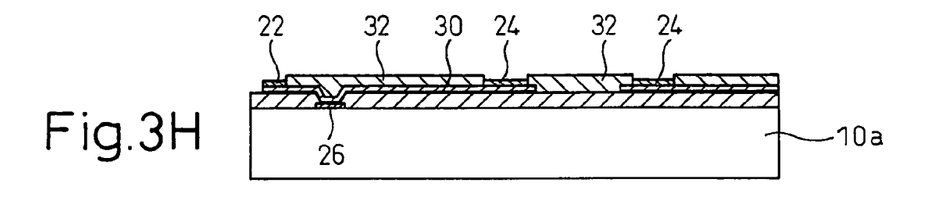

As shown in FIG. 3H, by electroplating nickel and electroplating gold using the rewiring patterns 30 as plating power layers, connection pads 22 and test pads 24 are formed in the openings 22a and openings 24a.

Due to this, the structure of the present invention where the plurality of rewiring patterns 30 extending from the peripheral regions to the inside region of the electrode terminal formation surface 10S connect the individual electrode terminals 26 and the corresponding connection pads 22 and test pads 24 is obtained.

The above production steps do not require any special test apparatus or other specialized facilities from the conventional method used for formation of rewiring patterns on a semiconductor wafer and can be easily performed by existing production facilities.

The semiconductor device 20 shown in FIG. 1 is obtained by forming connection pads 22 and test pads all together on an effective surface of a semiconductor wafer 10a by the above production steps, then dicing the wafer into individual semiconductor chips 10. The thus obtained semiconductor device 20 is a so-called "chip size package".

The semiconductor device 20 is provided with test pads 24, so it is possible to finish the testing of properties in advance, then mount only good pieces in the products. The test pads 24 may be used to the required inspections of the high frequency characteristics etc.

Further, the semiconductor device 20 is provided with connection pads 22 for wire bonding, so can be mounted on a wiring board by wire bonding in exactly the same way as a conventional semiconductor device.

Figure 4:
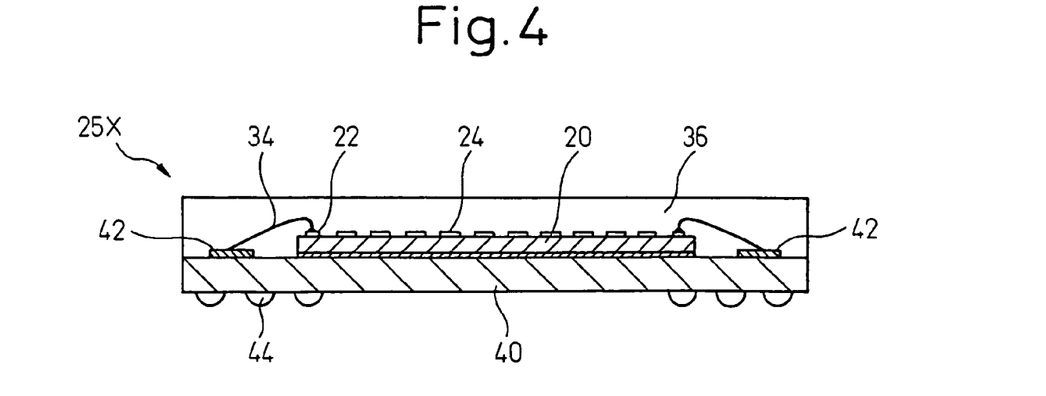
FIG. 4 is a cross-sectional view of an example of the configuration of a semiconductor device according to the first aspect of the invention.

For example, the semiconductor device 25X shown in FIG. 4 is an example comprised of the semiconductor device (chip size package) 20 of FIG. 1 mounted on a wiring board 40. The exact same procedure is followed as with a conventional chip size package to bond the device on the mounting surface of the wiring board 40, then the connection pads 22 of the semiconductor device 20 are connected to the connection electrodes 42 of the wiring board 40 by wire bonding, then a sealing resin 36 is used for sealing. In the figure, 34 is a bonding wire, while 44 is a solder ball or other external connection terminal.

Figure 5:
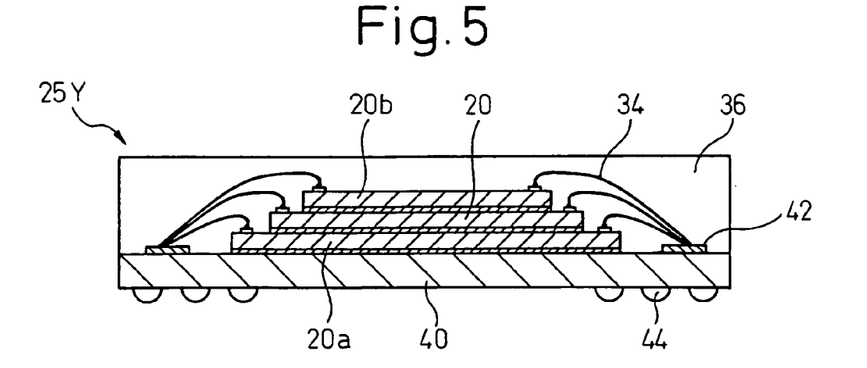
FIG. 5 is a cross-sectional view of another example of the configuration of a semiconductor device according to the first aspect of the invention.

The semiconductor device 25Y shown in FIG. 5 is an example comprised of a wiring board 40 on which conventional semiconductor chips 20a and 20b and a semiconductor device 20 of the present invention are stacked. In this example, the conventional semiconductor chips 20a and 20b are arranged at the bottommost level (side close to wiring board 40) and the topmost level and the semiconductor device 20 of the present invention is arranged in the center level sandwiched between the two. The semiconductor device 20 of the present invention is formed to the chip size, so can be stacked on the wiring board 40 in exactly the same way as the conventional semiconductor chips 20a and 20b. Further, the semiconductor chips 20a and 20b and the semiconductor device 20 can be connected with the connection electrodes 42 of the wiring board 40 by wire bonding by exactly the same method as a conventional semiconductor device using existing facilities.

As shown in FIG. 4 and FIG. 5, since the semiconductor device 20 of the present invention can be tested in advance for properties to judge quality, then only good quality piece mounted, it is possible to greatly improve the yield at the stage of producing the completed products 25X and 25Y of the semiconductor device.

In the example shown in FIG. 5, only the semiconductor chip at the center among the stacked semiconductor chips was formed as the testable semiconductor device 20 of the present invention. All of the semiconductor chips mounted may also be made semiconductor devices 20 provided with test pads 24 according to the present invention, but providing only the semiconductor chip requiring testing of properties in advance with test pads to make it a semiconductor device 20 of the present invention is effective from the viewpoint of the production costs.

Further, the semiconductor device 20 of the present invention having the test pads 24 can be made the chip size in the same way as an ordinary semiconductor chip not having test pads 24, so products mounting these stacked together can be made compact in the same way as the past.

Figure 6:
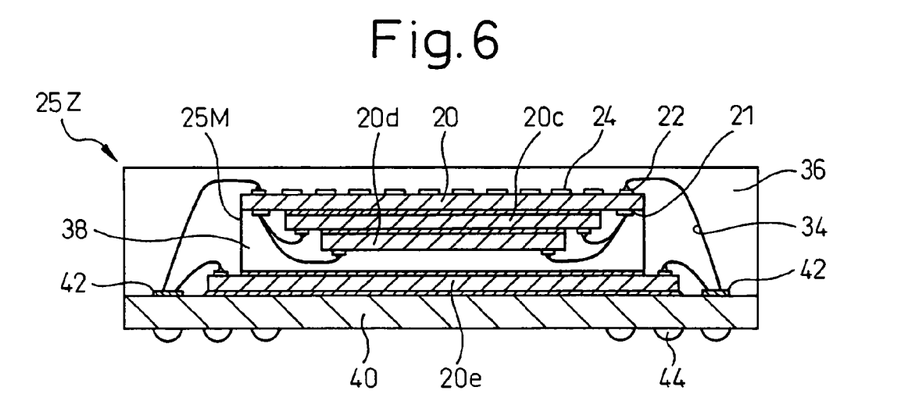
FIG. 6 is a cross-sectional view of still another example of the configuration of a semiconductor device according to the first aspect of the invention.

The semiconductor device 20 of the present invention can be used in various forms. For example, the semiconductor device 25Z shown in FIG. 6 is an example of a wiring board 40 mounted in advance with a semiconductor chip 20e by flip-chip connection and on which a semiconductor module 25M including the semiconductor device 20 of the present invention is mounted.

The semiconductor module 25M is formed by stacking ordinary semiconductor chips 20c and 20d not provided with test pads on the back surface of a semiconductor device 20 of the present invention provided with test pads 24 (surface at opposite side to electrode terminal formation surface), connecting the semiconductor chips 20c and 20d and the electrodes 21 provided on the back surface of the semiconductor device 20 by wire bonding, then sealing by a sealing resin 38.

The semiconductor module 25M is mounted on the wiring board 40 by bonding the sealing resin side surface of the semiconductor module 25M on the top surface of the semiconductor chip 20e bonded to the wiring board 40. The connection pads 22 of the semiconductor device 20 of the semiconductor module 25 mounted and the connection electrodes 42 of the wiring board 40 are connected by wire bonding and sealed by a sealing resin 36, whereby the semiconductor device 25Z is completed.

As explained above, the semiconductor device 20 of the present invention can not only be used alone, but can also be used as a combination of a plurality of semiconductor devices 20 or as a combination with ordinary semiconductor chips. The semiconductor device 20 of the present invention is formed to the chip size, so is easy to use in combination with ordinary semiconductor chips.

The semiconductor device of the present invention can be obtained by conducting tests in advance and only assembling good pieces into the product, so the product yield is improved and as a result the production costs are reduced. The test pads and connection pads can be easily formed on the electrode terminal formation surface of the semiconductor chip at a low cost by the conventional step of forming rewiring patterns on the semiconductor wafer, so the yield can be improved and therefore the costs greatly improved and the overall production costs reduced. In particular, when mounting a high performance semiconductor chip, since the required properties can be tested for in advance before mounting, waste can be eliminated and the production costs can be effectively reduced.

EXAMPLE 2

Figure 7:
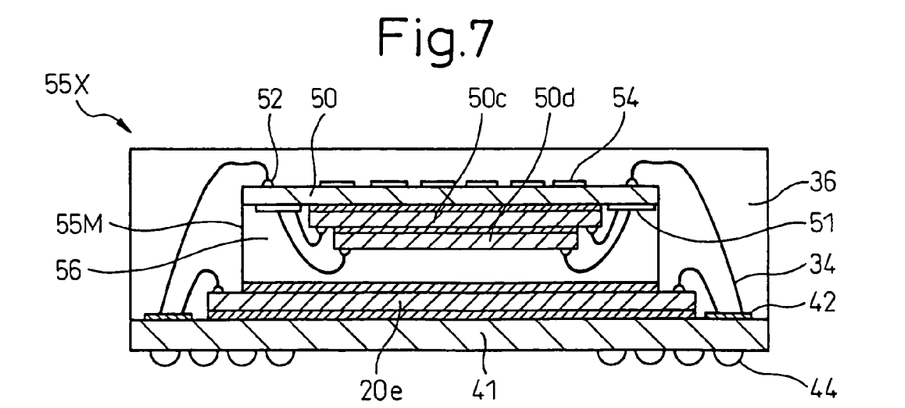
FIG. 7 is a cross-sectional view of an example of the configuration of a semiconductor device using an interposer according to a second aspect of the invention.

FIG. 7 is a cross-sectional view of a semiconductor device 55X using an interposer according to a second aspect of the invention.

The semiconductor device 55X is comprised of an ordinary wiring board 41 mounting in advance an ordinary (no test pad) semiconductor chip 20e by wire bonding connection and a semiconductor module 55M including an interposer 50 of the present invention carried on it.

The interposer 50 of the present invention is provided with connection pads 52 for wire bonding and test pads 54 for testing the properties of semiconductor chips on the same surface. The test pads 54 are connected with the individually corresponding connection pads 52 by rewiring patterns (not shown). The interposer 50 is for example an ordinary printed wiring board. The connection pads 52 and the test pads 54 are preferably metal plated on their surfaces.

The semiconductor module 55M is formed by stacking ordinary semiconductor chips 50c and 50d on the back surface of the interposer 50 (surface at opposite side to surface where connection pads 52 and test pads 54 are arranged), connecting the semiconductor chips 50c and 50d and the electrodes 51 provided on the back surface of the interposer 50 by wire bonding, then sealing by a sealing resin 56. The electrodes 51 of the interposer 50 are connected to individually corresponding connection pads 52 and are connected to test pads 54 through the connection pads 52. Due to this, it is possible to easily test the properties of the semiconductor chips 50c and 50d through the test pads 54 of the interposer 50.

The semiconductor module 55M is mounted on the wiring board 41 by bonding the sealing resin side surface of the semiconductor module 55M on the top surface of the semiconductor chip 20e bonded to the wiring board 41. The connection pads 52 of the interposer 50 of the present invention of the semiconductor module 55 mounted and the connection electrodes 42 of the wiring board 41 are connected by wire bonding and sealed by a sealing resin 36, whereby the semiconductor device 55X is completed.

Among the semiconductor chips 50c, 50d, and 20e forming the semiconductor device 55X, the semiconductor chips 50c and 50d have already been judged good in quality by the test of properties in the state of the semiconductor module 55M. Since it is possible to use semiconductor modules 55M mounting only good quality chips, only the semiconductor chip 20e may include defects. Therefore, the yield is improved compared with conventional semiconductor devices of the same type.

Further, the semiconductor chips are connected by wire bonding. The package does not become remarkably larger like with the case of connection using solder balls.

Note that as the normal semiconductor chips, two, 50c and 50d, were assembled into the semiconductor module, but of course the number of semiconductor chips assembled does not have to be limited to this. One or three or more are also possible.

Figure 8:
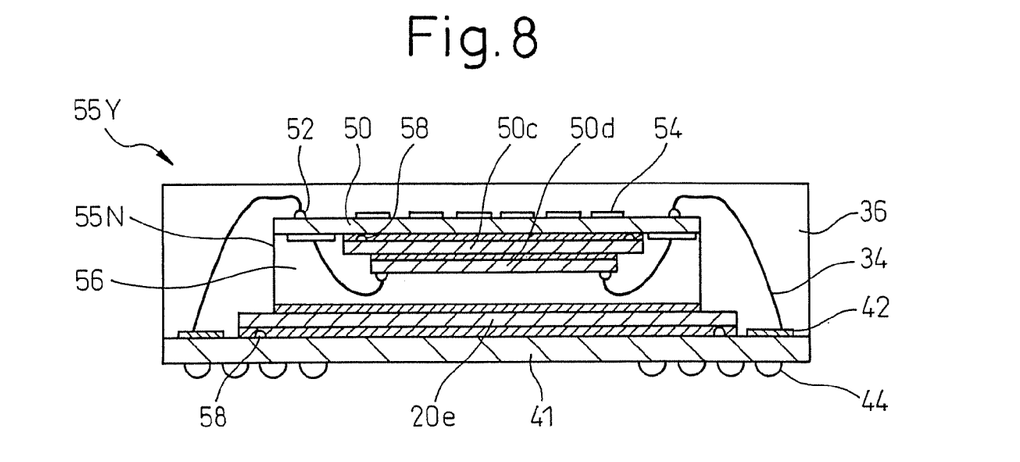
FIG. 8 is a cross-sectional view of another example of the configuration of a semiconductor device using an interposer according to the second aspect of the invention.

The semiconductor device 55Y shown in FIG. 8 has a basic configuration the same as the semiconductor device 55X of FIG. 7, but differs in the point that the semiconductor chips 50c and 20e are connected to the interposer 50 of the present invention and the wiring board 41 by flip-chip connection. As the flip-chip connection method, a known technique can be used. For example, the method of flip-chip connection by joining stud bumps 58 formed in advance on the semiconductor chips 50c and 20e by solder (not shown) formed in advance on the wiring board 41 may be used. By applying flip-chip connection to the semiconductor chips 50c and 20e, the size can be further reduced compared with the example of FIG. 7.

In the examples of FIG. 7 and FIG. 8, connection pads 52 and test pads 54 were provided on the same surface of the interposer 50 of the present invention, but there is no need to limit the surface where the connection pads and test pads are arranged in the present invention to the same surface.

Figure 9:
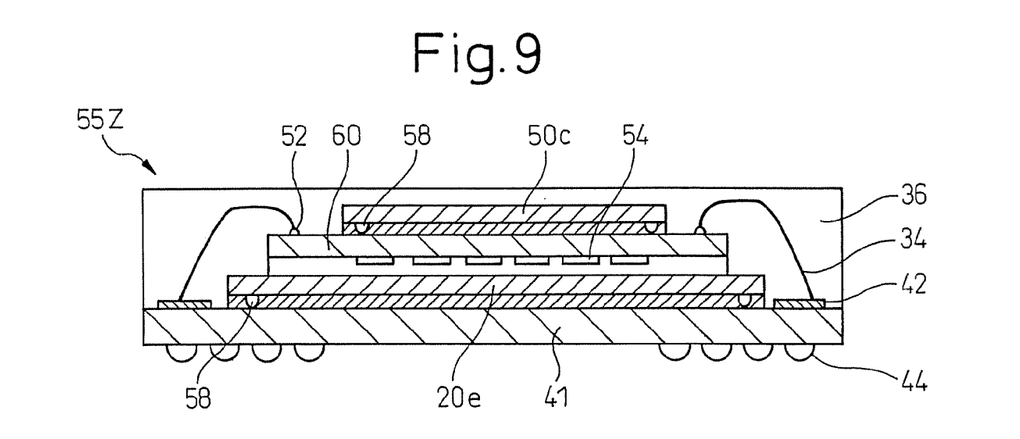
FIG. 9 is a cross-sectional view of still another example of the configuration of a semiconductor device using an interposer according to the second aspect of the invention.

For example, in the semiconductor device 55Z shown in FIG. 9, the interposer 60 of the present invention is provided on one surface (top surface in the figure) with connection pads 52 and semiconductor chip connection terminals (not shown) and is provided on the other surface (bottom surface in the figure) with test pads 54. The test pads 54 are connected with the corresponding connection pads 52 by rewiring patterns (not shown). The semiconductor chip 50c is connected by flip-chip connection with the semiconductor chip connection terminals on said one surface (top surface) of the interposer 60. As a result, a semiconductor module comprised of an interposer 60 and a semiconductor chip 50c is obtained. Semiconductor chips 50c are tested for properties and judged for quality through the test pads 54 of the interposer 60. Only semiconductor modules including good semiconductor chips 50c are used for the next step.

Next, in the same way as the example explained in FIG. 7, the above good semiconductor module (60+50c) is mounted on an ordinary wiring board 41 mounting an ordinary (no test pad) semiconductor chip 20e by flip-chip connection. After this, the interposer 60 of the present invention and the wiring board 41 are connected by bonding wires 34 then sealed by a sealing resin 36, whereby the semiconductor device 55Z is completed.

In this example, a single resin sealing operation is enough, so compared with the case of FIG. 7 where the resin sealing operation is performed twice, the cost can be reduced by that amount. At the same time, since there is no need to add extract thickness for the sealing resin, the semiconductor device 55Z as a whole can be made thinner.

INDUSTRIAL APPLICABILITY

The semiconductor device and interposer of the present invention are provided with test pads for testing the properties of semiconductor chips, so it is possible to judge quality in advance by tests and mount only good pieces, so it is possible to prevent product defects due to mounting of defective semiconductor chips and thereby possible to improve the product yield.

Further, the semiconductor device of the present invention is formed in a chip size, so it is possible to mount it in the same way as an ordinary semiconductor chip and obtain a compact semiconductor device.

Further, the semiconductor device of the present invention can be easily stacked in a plurality of units or stacked with ordinary semiconductor chips, so it is possible to provide various types of semiconductor devices.

The invention claimed is:

1. A semiconductor device, comprising:
    wire bonding connection pads at peripheral regions, surrounding an inside region, of an electrode terminal formation surface of a semiconductor chip;
    test pads to test the semiconductor chip, arranged in the inside region; and
    a plurality of rewiring patterns, extending from respective peripheral regions to the inside region of said electrode terminal formation surface, individual ones of the plurality of rewiring patterns connecting respective, individual electrode terminals and corresponding connection pads and test pads.

2. The semiconductor device as set forth in claim 1, wherein
    one or more of said semiconductor devices and a semiconductor chip are carried on a wiring board,
    connection pads of each said semiconductor device and connection electrodes of said wiring board are connected by wire bonding, and
    each said semiconductor device and/or each said semiconductor chip is sealed by resin on said wiring board.

3. A semiconductor device as set forth in claim 1, wherein the electrode terminals are exposed through openings of a protective insulation layer covering said electrode terminal formation surface, the rewiring patterns extend on said protective insulation layer and are connected to said electrode terminals via said openings, said rewiring patterns and said protective insulation layer are further covered by an insulation layer, and said connection pads and said test pads, connected to said rewiring patterns, are exposed through openings in said insulation layer.

4. The semiconductor device as set forth in claim 3, wherein
    one or more of said semiconductor devices and a semiconductor chip are carried on a wiring board,
    connection pads of each said semiconductor device and connection electrodes of said wiring board are connected by wire bonding, and
    each said semiconductor device and/or each said semiconductor chip is sealed by resin on said wiring board.

5. A semiconductor device as set forth in claim 1, wherein:
    the test pads are arranged in an array on the inside region.

6. A semiconductor device as set forth in claim 5, characterized in that said electrode terminals are exposed through openings in a protective insulation layer covering said electrode terminal formation surface, said rewiring patterns extend on said protective insulation layer and are connected to said electrode terminals via said openings, said rewiring patterns and said protective insulation layer are further covered by an insulation layer, and said connection pads and said test pads connected to said rewiring patterns are exposed through openings in said insulation layer.

7. The semiconductor device as set forth in claim 5, wherein
one or more of said semiconductor devices and a semiconductor chip are carried on a wiring board, connection pads of each said semiconductor device and connection electrodes of said wiring board are connected by wire bonding, and each said semiconductor device and/or each said semiconductor chip is sealed by resin on said wiring board.

* * * * *